United States Patent [19]

Yacobucci et al.

[11] Patent Number: 4,478,992

[45] Date of Patent: Oct. 23, 1984

[54] POLYMERIZABLE VINYL BENZOATES

[75] Inventors: Paul D. Yacobucci; John C. Wilson, both of Rochester, N.Y.

[73] Assignee: Eastman Kodak Company, Rochester, N.Y.

[21] Appl. No.: 530,813

[22] Filed: Sep. 9, 1983

Related U.S. Application Data

[62] Division of Ser. No. 329,548, Dec. 10, 1981, Pat. No. 4,420,630.

[51] Int. Cl.$^3$ ........................ C08L 33/14; C08F 20/38

[52] U.S. Cl. .................................................... 526/288

[58] Field of Search ......................................... 526/288

[56] References Cited

U.S. PATENT DOCUMENTS

| | | |
|---|---|---|
| 2,677,678 | 5/1954 | Morris et al. . |
| 4,247,625 | 1/1981 | Fletcher et al. . |
| 4,259,469 | 3/1981 | Wilson et al. . |

*Primary Examiner*—Joseph L. Schofer

*Assistant Examiner*—Peter F. Kulkosky

*Attorney, Agent, or Firm*—Arthur H. Rosenstein

[57] ABSTRACT

Disclosed herein are monomeric compounds and methods of preparing these compounds which have the formula:

$$CHR{=}CR'{-}Ar{-}\overset{\overset{O}{\|}}{C}{-}O{-}Ar'{-}X$$

wherein:

R and R' are independently selected from the group consisting of H, halide and alkyl;

Ar and Ar' are independently arylene;

X is selected from the group consisting of $NHSO_2R^2$, $CH_2NHSO_2R^2$ and $SO_2NHR^2$ and $R^2$ is selected from the group consisting of alkyl, aryl and aralkyl.

These monomers are homopolymerized or copolymerized with one or more other monomers to yield polymers having desirable solubility characteristics. A particular use for the polymers is in relief image materials or as binders in photographic layers.

3 Claims, No Drawings

POLYMERIZABLE VINYL BENZOATES

This application is a divisional of Ser. No. 329,548 now U.S. Pat. No. 4,420,630.

BACKGROUND OF THE INVENTION

1. Field of the Invention

This invention relates to organic materials which are useful in preparing polymers particularly useful in the graphic arts and photographic arts. In one of its aspects, it relates to the use of such materials to prepare polymers which are incorporated into radiation-sensitive elements to obtain a desirable combination of properties.

2. Description of Related Art

The formation of polymerizable vinyl arylsulfonamide esters which are soluble in acetone, which is the preferred solvent for coating polymeric binders for radiation-sensitive elements is described in U.S. Pat. No. 4,259,469 issued Mar. 31, 1981 to the present inventors. These monomers were formed by a simple condensation reaction of a vinyl aryl halide with a hydroxy compound. The method of preparation of these monomers, however, results in only a limited range of monomers useful for the purposes intended.

It would be highly desirable to have additional monomers which are soluble in acetone and polymers thereof which are useful as binders for photographic materials.

SUMMARY OF THE INVENTION

The present invention provides polymerizable vinylbenzoates which are soluble in acetone, methyl ethyl ketone, tetrahydrofuran and dioxane, and are prepared by a novel method of preparation. The present invention also provides polymers formed from such monomers.

The polymers of the present invention are useful in many applications, but are particularly useful as copolymers in radiation-sensitive materials used in the graphic arts. Such copolymers which can also comprise units of polymerized vinyl ethers having pendant aldehyde groups are crosslinked with reagents, such as amines, to provide organic solvent insoluble areas. These insoluble areas in light-exposed regions of a lithographic plate or photoresist provide negative relief images. Preferred uses for the polymers of this invention are disclosed in U.S. Pat. No. 4,247,625 issued Jan. 27, 1981.

Certain other copolymers comprise units of polymerized ethylenically unsaturated monomers having ionic groups which form copolymers soluble in solvent systems, such as acetone-water mixtures, water, alcohol-water mixtures, methanol and the like. Such anionic or cationic copolymers are suitable for aqueous processing.

The polymers of the present invention are also useful as binder vehicles in a variety of applications, such as in various light-sensitive compositions, subbing layers and the like.

One aspect of the present invention comprises a compound having the formula:

$$CHR{=}CR'{-}Ar{-}\overset{\overset{\displaystyle O}{\|}}{C}{-}O{-}Ar'{-}X \qquad (I)$$

wherein

R and R′ are independently selected from the group containing of hydrogen, halide or alkyl;

Ar and Ar′ are independently arylene;

X is selected from the group consisting of $NHSO_2R^2$, $CH_2NHSO_2R^2$ and $SO_2NHR^2$ and $R^2$ is selected from the group consisting of alkyl, aryl and aralkyl.

In another aspect of the present invention, a process of preparing the compounds of formula (I) comprises (1) reacting a phenol having the formula $$HO{-}Ar'{-}X \qquad (II)$$

with a benzoyl chloride having the formula $$BrCH_2CH_2{-}Ar{-}COCl \qquad (III)$$

wherein

Ar, Ar′ and X are as defined above, and (2) dehydrobrominating the product of step (1).

Still another aspect of the present invention comprises a polymer formed from: (a) about 1 to about 100 mole percent of one or more monomers having formula (I) and (b) from 0 to about 99 mole percent of one or more additional ethylenically unsaturated polymerizable monomers.

In still another aspect of the present invention a process of preparing the above-described polymers comprises (1) reacting a phenol having formula (II) with a benzoyl chloride having formula (III), (2) dehydrobrominating the product of step (1) and (3) polymerizing the monomer formed in step (2) with 0 to 99 mole percent of one or more additional ethylenically unsaturated polymerizable monomers.

DETAILED DESCRIPTION OF THE INVENTION

The monomers of the present invention are depicted by the formula:

$$CHR{=}CR'{-}Ar{-}\overset{\overset{\displaystyle O}{\|}}{C}{-}O{-}Ar'{-}X$$

wherein:

R and R′ are independently hydrogen; halide, such as fluoride, chloride, bromide and iodide; or alkyl, preferably having from 1 to 4 carbon atoms, such as methyl, ethyl, propyl, isopropyl and t-butyl, including substituted alkyl such as haloalkyl such as chloromethyl and 1,2-dibromoethyl.

Ar and Ar′ are arylene, preferably having from 6 to 18 carbon atoms, including phenylene, naphthylene, phenylenedimethylene and diphenylene, which arylene is unsubstituted or substituted, for example, with alkyl, preferably containing 1 to 4 carbon atoms, halide, sulfonamido, nitro or alkoxy.

X is selected from the group consisting of $NHSO_2R^2$, $CH_2NHSO_2R^2$ and $SO_2NHR^2$ and $R^2$ is selected from the group consisting of alkyl such as described above for R and R′; aryl such as phenyl and naphthyl including substituted aryl such as chlorophenyl and methylphenyl; and aralkyl such as benzyl.

Exemplary monomers corresponding to formula (I) include 4-(methanesulfonamido)phenyl 4-vinylbenzoate, 4-(α-methanesulfonamido)tolyl 4-vinylbenzoate, 4-(N-methylsulfamoyl)phenyl 4-vinylbenzoate, N-methyl-4-sulfamoylphenyl 4-vinylbenzoate, 4-(N-phenylsulfamoyl)phenyl 4-vinylbenzoate, 4-(butanesulfonamido)phenyl 4-vinylbenzoate, 4-(propanesulfonamido)phenyl 4-vinylbenzoate, 4-(benzene sulfonamido)phenyl 4-vinylbenzoate, 4-(ethanesulfonamido)phenyl 4-vinylbenzoate and 4-(N-butylsulfamoyl)phenyl 4-vinylbenzoate.

Preferred monomers of the present invention are those having formula (I) wherein R and R′ are hydrogen; Ar and Ar′ are phenylene; and X is $SO_2NHR^2$ wherein $R^2$ is $CH_3$.

The novel process of preparing monomers of formula (I) comprises the first step of reacting a phenol having the formula HO—Ar′—X with a benzoyl chloride having the formula $BrCH_2CH_2$—Ar—COCl preferably in an organic solvent medium. Ar, Ar′ and X are as defined above.

Useful phenols include N-(4-hydroxyphenyl)methanesulfonamide, N-(4-hydroxybenzyl)methanesulfonamide, N-phenyl-4-hydroxybenzenesulfonamide, N-(4-hydroxyphenyl)butanesulfonamide and N-methyl-4-hydroxybenzenesulfonamide.

Examples of useful benzoyl chlorides include p-(2-bromoethyl)benzoyl chloride and 4-(2-bromoethyl)-naphthoyl chloride. The reactants are prepared by known techniques. p-(2-Bromoethyl)benzoyl chloride is prepared according to the procedure of Foreman and McElvin, *J. American Chemical Society,* 62, 1435 (1940). N-substituted 4-hydroxybenzenesulfonamides are prepared by the method of Wagner et al., *J. Med. Chem.*, 8, 377 (1965). N-(4-hydroxyphenyl)sulfonamides are prepared by the method of Beckwith et al., *J. Org. Chem.*, 19, 1708 (1954). N-(4-hydroxybenzyl)sulfonamides are prepared by catalytic reduction of N-(4-hydroxybenzlidine)sulfonamides which are prepared by condensing 4-hydroxybenzaldehyde with sulfonamides according to the procedure described in Markov and Kosyan, *Ukrainski Khinicheski Zhurnal,* 33(3), 299 (1967).

The described reactants are reacted in the presence of an acid acceptor which is defined as a compound which will react with the released halo acid condensate to form a salt and aid in shifting equilibrium to product. Exemplary acid acceptors include hydroxides, such as alkali metal hydroxides, alkaline earth metal hydroxides, quarternary alkyl ammonium hydroxides and the like; alkoxides, such as aluminum butoxide, sodium ethoxide and the like; carbonates such as sodium carbonate, potassium carbonate and the like; trialkylamines such as triethylamine, tributylamine and the like; pyridine, picoline, weak base ion-exchange resins, such as amberlite IR-4B and IR-45 and the like and others well known in the art. The acid acceptors are generally present in the reaction mixture in ratios of 1:1 to 2.2:1.0 with the hydroxy compound.

Although the ratio of reactants is variable, it is preferred that the reaction contain from about 1 to about 2 moles of phenol for every mole of benzoyl chloride.

If desired, a mutual inert solvent is employed to dissolve the reactants. The products are removed from the reaction solvent by any suitable means such as filtration, concentration and the like. The amount of solvent used is not critical and preferably between about 75 and 99 weight percent of the reaction mixture. Suitable solvents include chlorinated solvents, such as methylene chloride, ethylene chloride and the like, diethyl ether, tetrahydrofuran and the like.

The reaction generally proceeds at a temperature between about $-10°$ C. and 10° C. and preferably between about $-5°$ C. to about 0° C. The reaction pressure can be from subatmospheric to superatmospheric pressures of 1000 PSIG or higher. Generally the reaction is carried out at atmospheric pressure.

The reaction time is a function of reaction temperature, pressure and the particular reactants employed. In general, reaction times are between 0.5 and 4 hours.

The reaction product is dehydrobrominated to form the useful monomer. The dehydrobromination process comprises treatment of the reaction product with an alkaline reagent, preferably potassium carbonate in the presence of acetone, at room temperature for 48 hours to yield the vinylbenzoate monomer.

The monomers described herein are useful in making the acetone-soluble polymers of the present invention.

The polymers comprise about 1 to 100 mole percent of one or more polymerized monomers of the described formula (I). Mixtures of such monomers can be used, if desired, in forming the polymers.

The copolymers can comprise up to 99 mole percent of recurring units derived from one or more additional ethylenically unsaturated polymerizable monomers, each containing, for example, at least one $$-CH{=}C< \text{ or } CH_2{=}C<$$

group. Exemplary monomers include, for example, vinyl esters, such as vinyl acetate, vinyl butyrate and the like; vinyl amides, such as acrylamide, methacrylamide, N-methylacrylamide, N-isopropylacrylamide; vinyl nitriles, such as acrylonitrile, methylacrylonitrile, 3-butene nitrile and the like; vinyl ketones, such as methyl vinyl ketone and the like; vinyl halides, such as vinyl chloride, vinyl bromide, vinylidene chloride and the like; vinyl ethers, such as allyl phenyl ether, methyl vinyl ether, and o-formylphenyl vinylbenzyl ether; α,β-unsaturated acids or esters thereof, such as acrylic acid, methacrylic acid, methyl acrylate, butyl methacrylate, 2-dimethylaminoethyl methacrylate, 2-ethylhexyl acrylate, 2-hydroxyethyl methacrylate, m-formylphenyl methacrylate and the like; olefins and diolefins, such as ethylene, propylene, butadiene, isoprene, 1,1-diphenylethylene and the like; vinyl aromatics, such as styrene, α-methylstyrene, p-chlorostyrene and the like; 4,4,9-trimethyl-8-oxo-7-oxa-4-azonia-9-decene-1-sulfonate; 2-(methacryloyloxy)ethyltrimethylammonium methosulfate; N-vinylsuccinimide; N-vinylphthalimide; N-vinylpyrazolidone and the like. Mixtures of monomers can be used, if desired.

In one preferred embodiment of the present invention, novel uncrosslinked polymers which are soluble in acetone, tetrahydrofuran and methyl ethyl ketone and the like, are formed from:

(a) about 1 to about 99 mole percent of one or more monomers having formula (I); and
(b) about 1 to about 99 mole percent of one or more additional ethylenically unsaturated polymerizable monomers containing pendant aldehyde groups which crosslink with reagents, such as amines.

Exemplary of such aldehyde-containing monomers include m-formylphenyl methacrylate, m-formylphenyl acrylate, acrylamidoacetaldehyde, p-(2-methacryloyloxyethoxy)benzaldehyde and the like, as described in U.S. Pat. No. 2,929,710, which is incorporated herein by reference; and monomers having the formula (IV),

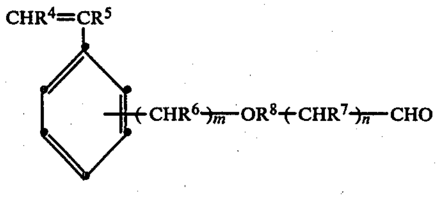

IV wherein:

- $R^4$, $R^5$, $R^6$ and $R^7$ are independently hydrogen; or alkyl having from 1 to 4 carbon atoms, such as methyl, ethyl, propyl, butyl, isopropyl, tert-butyl and the like;
- $R^8$ is arylene having from 6 to 18 carbon atoms, such as phenylene, naphthylene, anthrylene, biphenylylene, including arylenes substituted with any of the above substituents;
- m is an integer of from 1 to 4; and
- n is an integer of from 0 to 4.

Exemplary monomers corresponding to formula (IV) include o-, p- or m-formylphenyl vinylbenzyl ether; o-, p- or m-(2-formylethoxy)phenyl vinylbenzyl ether; 2-, 3- or 4-formylnaphthyl vinylbenzyl ether; formylbiphenylyl vinylbenzyl ether; o- or p-formyl-2-methylphenyl vinylbenzyl ether; o-, p- or m-formylphenyl α-chlorovinylphenylethyl ether and the like. Mixtures of these monomers can be used, if desired.

Preferred polymers of the present invention formed from monomers having formula (IV) are those wherein $R^4$, $R^5$, $R^6$ and $R^7$ are all hydrogen, and most preferably when, additionally, m is 1 and n is 0. Particularly preferred polymers are obtained when $R^8$ is phenylene, including such monomers as o-, p- or m-formylphenyl vinylbenzyl ether.

Methods of preparing monomers of formula (IV) are discussed in U.S. Pat. No. 4,225,689, issued Sept. 30, 1980.

In another embodiment, novel copolymers soluble in acetone-water, methanol, methanol-water and water solvent systems when used in minor amounts are suitable for aqueous coating and processing. These copolymers can be formed from:

(a) about 1 to about 99 mole percent of one or more monomers having formula (I); and (b) about 1 to about 99 weight percent of one or more additional ethylenically unsaturated polymerizable monomers having ionic groups.

Examples of such copolymerizable monomers include the following and/or their salts:

N-(2-methacryloyloxyethyl)-N,N,N-trimethylammonium methosulfate
N-benzyl-N,N-dimethyl-N-vinylbenzylammonium chloride
Aconitic acid
2-Acrylamido-2-methylpropanesulfonic acid
3-Acrylamidopropane-1-sulfonic acid
Acrylic acid
Methacrylic acid
4-Acryloyloxybutane-1-sulfonic acid
3-Acryloyloxypropionic acid
3-Acryloyloxybutane-1-sulfonic acid
3-Acryloyloxypropane-1-sulfonic acid
4-t-Butyl-9-methyl-8-oxo-7-oxa-4-aza-9-decene-1-sulfonic acid
α-Chloroacrylic acid
Maleic acid
Chloromaleic acid
2-Methacryloyloxyethyl-1-sulfonic acid
Citraconic acid
Crotonic acid
Fumaric acid
Mesaconic acid
α-Methyleneglutaric acid
Monoethyl fumarate
Monomethyl α-methyleneglutarate
Monomethyl fumarate
Vinylsulfonic acid
p-Styrenesulfonic acid
4-Vinylbenzylsulfonic acid
Acryloyloxymethylsulfonic acid
4-Methacryloyloxybutane-1-sulfonic acid
2-Methacryloyloxyethane-1-sulfonic acid
3-Methacryloyloxypropane-1-sulfonic acid
2-Acrylamido-2-methylpropane-1-sulfonic acid
2-Methacrylamido-2-methylpropane-1-sulfonic acid
3-Acrylamido-3-methylbutane-1-sulfonic acid; and
Maleic anhydride.

The preferred monomer having an ionic group is N-(2-methacryloyloxy)ethyltrimethylammonium methosulfate.

Although the amount of polymerized monomer of formula (I) incorporated in the polymers of the present invention can vary from about 1 to about 100 mole percent, preferably the amount is from about 50 to about 99 mole percent. The preferred amount of additional ethylenically unsaturated polymerizable monomers is from about 0 to about 50 mole percent.

Exemplary polymers of the present invention include poly[4-(α-methanesulfonamido)tolyl 4-vinylbenzoate], poly[4-(methanesulfonamido)phenyl 4-vinylbenzoate], poly(N-phenyl-4-sulfamoylphenyl 4-vinylbenzoate and poly(N-methyl-4-sulfamoylphenyl 4-vinylbenzoate).

The process of preparing the polymers of the present invention comprises three steps, the first two being that of making the monomer by the method described earlier. The third step comprises homopolymerization of these monomers or copolymerization with each other, or with the additional ethylenically unsaturated polymerizable monomers.

Polymerization can be carried out using techniques available to those skilled in the polymer chemistry art, including bulk, suspension, emulsion, solution and continuous techniques. Preferably, it is carried out in organic solvent solutions, usually solvents such as p-dioxane, N,N-dimethylformamide, tetrahydrofuran and the like, and most preferably in N,N-dimethylformamide.

The temperature at which the polymers of the present invention are prepared is subject to wide variation, since this temperature depends upon such variable features as the specific monomers used, duration of heating, pressure employed and like considerations. However, the polymerization temperature generally does not exceed about 110° C., and most often it is in the range of about 40° to about 100° C. The polymerization can be carried out in a suitable vehicle, for example, water or mixtures of water with water-miscible solvents, as exemplified by methanol, ethanol, propanol, isopropyl alcohol, butyl alcohol and the like when emulsion or suspension techniques are used. The pressure employed in the polymerization, if any, is usually only sufficient to maintain the reaction mixture in liquid form, although either superatmospheric or subatmospheric pressures can be used. The concentration of polymerizable monomer in the polymerization mixture can be varied widely with concentrations up to about 80 percent by weight, and preferably from about 10 to about 50 percent by weight, based on the weight of the vehicle, being satisfactory. Suitable catalysts for the polymerization reaction include, for example, from about 0.001 to about 2.0 weight percent of free radical catalysts, such as hydrogen peroxide, cumene hydroperoxide, azotype initiators and the like. In redox polymerization systems, conventional ingredients can be employed. If desired, the polymer can be isolated from the reaction vehicle by freezing, salting out, precipitation in a non-solvent, such as diethyl ether, or any other procedure suitable for this purpose.

As indicated in U.S. Pat. No. 3,142,568, issued July 28, 1964, it is sometimes advantageous to include a surface active agent or compatible mixtures of such agents in emulsion or suspension preparation of vinyl or addition polymers. Suitable wetting agents include the nonionic, ionic and amphoteric types, as exemplified by the polyoxyalkylene derivatives, amphoteric amino acid dispersing agent, including sulfobetaines and the like. Such wetting agents are disclosed in U.S. Pat. Nos. 2,600,831, issued July 17, 1952; 2,271,622, issued Feb. 3, 1942; 2,271,623, issued Feb. 3, 1942; 2,275,727, issued Mar. 10, 1942; 2,787,604, issued Apr. 2, 1957; 2,816,920, issued Dec. 17, 1957 and 2,739,891, issued Mar. 27, 1956.

The equivalent molecular weights of the polymers of the present invention are subject to wide variation, but typically can be within the range of from about 10,000 to about 500,000. These polymers generally have inherent viscosities within the range of from about 0.10 to 4.5, and preferably from about 0.4 to about 1.2, as measured (unless otherwise indicated in this specification) in N,N-dimethylformamide (DMF) (0.25 g polymer in 100 ml solution) at 25° C. As used herein, the term "inherent viscosity" is determined by the formula:

$$\eta_{inh} = \frac{2.30 \log \eta_{rel}}{C}$$

wherein:

$\eta_{inh}$ is the inherent viscosity;

$\eta_{rel}$ is the relative viscosity of a DMF solution of the polymer; and

C is the concentration in grams (0.25) of polymer per 100 cc of solution.

The polymers of the present invention typically have glass transition temperatures within the range of about −10° C. to about 200° C. These temperatures can be determined by differential scanning colorimetry, as disclosed in *Techniques and Methods of Polymer Evaluation,* Volume 2, Marcel Dekker, Inc., New York, 1970.

The polymers of the present invention are soluble in a variety of organic solvents, including acetone, tetrahydrofuran, N,N-dimethylformamide, methyl ethyl ketone and the like. Typically, these solvents are used in the graphic arts to remove unexposed areas of photoresists or lithographic plates. Developer solvents have a solubility such that the crosslinking of the polymer results in a distinct solubility differential in organic solvents such that said solvents will dissolve uncrosslinked polymer but not crosslinked polymer, and for imaging compositions such as described in U.S. Pat. No. 4,239,848, issued Dec. 16, 1980, solubility is about 1.9 g of polymer dissolved in 9.6 cc of acetone. The crosslinkable polymers become insoluble after they are crosslinked.

The polymers of the present invention are particularly useful as binders in an imaging system comprising an aromatic dialdehyde capable of reacting with amines to form a dye, a material capable of generating amines in response to activating radiation and a binder that provides improved maximum densities for such an imaging system, such as described in U.S. Pat. No. 4,239,848, issued Dec. 16, 1980.

The polymers are compatible with radiation-sensitive compositions and are thus useful as binders for these materials in coating compositions.

This invention is further illustrated by the following examples, although it will be understood that these examples are included merely for purposes of illustration, and are not intended to limit the scope of the invention.

EXAMPLES 1-4

(a) Synthesis of 4-(Methanesulfonamido)phenyl 4-(2-bromoethyl)benzoate

To a mixture of 6.05 g (0.0323 mol) of N-(4-hydroxylphenyl)methane sulfonamide, 3.27 g (0.0323 mol) of triethylamine and 100 ml of methylene chloride was added a solution of 8.0 g (0.0323 mol) of p-(2-bromoethyl)benzoyl chloride in 75 mL of methylene chloride dropwise.

The reaction mixture was stirred for 4 hours at room temperature. The resultant solution was washed with 2% hydrochloric acid and twice with water, dried over magnesium sulfate and concentrated on a rotary evaporator to a white solid. Recrystallization from 700 ml of 1:1 ethanol:water gave 10.75 g (83.5% of theory) of 4-(methanesulfonamido)phenyl 4-(2-bromoethyl)benzoate; mp=161°-2° C.

Analysis calculated for $C_{16}H_{16}BrNO_4S$: C, 48.3; H, 4.0; Br, 20.1; N, 3.5; S, 8.1. Found: C, 48.4; H, 4.3; Br, 20.6; N, 3.7; S, 7.6.

Properties of the ethyl, propyl, and phenyl analogues similarly prepared are found in Table I.

(b) Synthesis of 4-(Methanesulfonamido)phenyl 4-vinylbenzoate

A mixture of 10.0 g (0.02511 mol) of 4-(methanesulfonamido)phenyl 4-(2-bromoethyl)benzoate, 3.47 g (0.02511 mol) of potassium carbonate and 100 ml of acetone was stirred at room temperature for 48 hours. The resultant mixture was filtered and the filtrate was condensed to a solid. Recrystallization from 1:1 1,2-dichloroethane:hexane gave 4.2 g (52.7% of theory) of 4-(methanesulfonamido)phenyl 4-vinylbenzoate; mp=172°-3° C.

Analysis calculated for $C_{16}H_{15}NO_4S$: C, 60.5; H, 4.8; N, 4.4; S, 10.1. Found: C, 59.7; H, 5.1; N, 4.5; S, 10.7.

Properties of the ethyl, propyl and phenyl analogues similarly prepared are found in Table II.

EXAMPLE 5

(a) Synthesis of 4-(α-Methanesulfonamido)tolyl 4-(2-bromoethyl)benzoate

To a mixture of 20.13 g (0.10 mol) of N-(4-hydroxybenzyl)methanesulfonamide, 10.2 g (0.10 mol) of triethylamine and 300 ml of methylene chloride cooled to 0° C., was added a solution of 24.75 g (0.10 mol) of p-(2-bromoethyl)benzoyl chloride in 100 ml of methylene chloride over approximately 40 minutes. The mixture was stirred for another 45 minutes, filtered, washed three times with water and dried over magnesium sulfate. After concentrating on a rotary evaporator, the residue was recrystallized from 1900 ml of 1:1 1,2-dichloroethane:hexane to yield 23.5 g (57.0% of theory) of 4-(α-methanesulfonamido)tolyl 4-(2-bromoethyl)benzoate; mp=141°-3° C.

Analysis calculated for $C_{17}H_{18}BrNO_4S$: C, 49.5; H, 4.4; Br, 19.4; N, 3.4; S, 7.8. Found: C, 49.0; H, 4.4; Br, 19.3; N, 3.4; S, 8.2.

(b) Synthesis of 4-(α-Methanesulfonamido)tolyl 4-vinylbenzoate

A mixture of 20.62 g (0.05 mol) of 4-(α-methanesulfonamido)tolyl 4-(2-bromoethyl)benzoate, 6.91 g (0.05 mol) of potassium carbonate and 200 ml of acetone was stirred at room temperature for approximately 55 hours. The mixture was filtered and the filtrate was concentrated to a white solid. All solids were combined, washed with water and recrystallized from acetonitrile. The yield of 4-(α-methanesulfonamido)tolyl 4-vinylbenzoate was 9.3 g (56.2% of theory); mp=167°-8° C.

Analysis calculated for $C_{17}H_{17}NO_4S$: C, 61.6; H, 5.2; N, 4.2; S, 9.7. Found: C, 61.3; H, 5.1; N, 4.4; S, 9.5.

EXAMPLES 6-7

(a) Synthesis of 4-(N-phenylsulfamoyl)phenyl 4-(2-bromoethyl)benzoate

To a mixture of 24.93 g (0.10 mol) of N-phenyl-4-hydroxybenzenesulfonamide, 10.12 g (0.10 mol) of triethylamine and 150 ml of methylene chloride was added, dropwise, a solution of 24.75 g (0.10 mol) of 4-(2-bromoethyl)benzoyl chloride in 150 ml of methylene chloride over a period of 12 minutes. The reaction mixture was stirred at room temperature for 3 hours, after which 500 ml of methylene chloride were added. The solution was washed once with 2% HCl and twice with water, dried over magnesium sulfate and concentrated to a white solid. Recrystallization from ethanol gave 39.7 g (86.1% of theory) of 4-(N-phenylsulfamoyl)phenyl 4-(2-bromoethyl)benzoate, mp=156°-7° C.

Analysis calculated for $C_{21}H_{18}BrNO_4S$: C, 54.8; H, 3.9; Br, 17.4; N, 3.0; S, 7.0. Found: C, 54.7; H, 4.1; Br, 17.4; N, 3.4; S, 7.4.

Properties of the N-butyl analogue, similarly prepared, are found in Table I.

(b) Synthesis of 4-(N-phenylsulfamoyl)phenyl 4-vinylbenzoate

A mixture of 18.5 g (0.0402 mol) of 4-(N-phenylsulfamoyl)phenyl 4-(2-bromoethyl)benzoate, 5.55 g (0.0402 mol) of potassium carbonate and 250 ml of acetone was stirred at room temperature for approximately 48 hours. The mixture was filtered and concentrated to an oily solid. Recrystallization from ethanol:water gave 11.7 g (76.7% of theory) of 4-(N-phenylsulfamoyl)phenyl 4-vinylbenzoate; mp=59°-60° C.

Analysis calculated for $C_{21}H_{17}NO_4S$: C, 66.5; H, 4.5; N, 3.7; S, 8.5. Found: C, 65.8; H, 4.3; N, 3.7; S, 9.0.

Properties of the similarly prepared N-butyl analogue are found in Table II.

The following Tables I and II illustrate the properties of Examples 1-7.

TABLE I

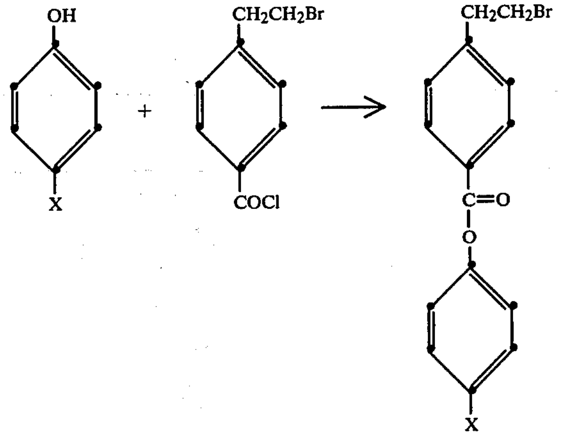

| | | | | Anal. | | | | | | | | | |
|---|---|---|---|---|---|---|---|---|---|---|---|---|---|
| | | | | Calculated | | | | | Found | | | | |
| Example | X | Yield, % | M.P., °C. | C | H | N | S | Br | C | H | N | S | Br |
| (5a) | $CH_2$–$NHSO_2CH_3$ | 57.0 | 141-3 | 49.5 | 4.4 | 3.4 | 7.8 | 19.4 | 49.0 | 4.4 | 3.4 | 8.2 | 19.3 |
| (4a) | NH–$SO_2$– 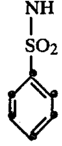 | 79.5 | 150-2 | 54.8 | 3.9 | 3.0 | 7.0 | 17.4 | 54.6 | 4.0 | 3.2 | 7.8 | 18.0 |
| (1a) | $-NHSO_2CH_3$ | 83.5 | 161-2 | 48.3 | 4.0 | 3.5 | 8.1 | 20.1 | 48.4 | 4.3 | 3.7 | 7.6 | 20.6 |

TABLE I-continued
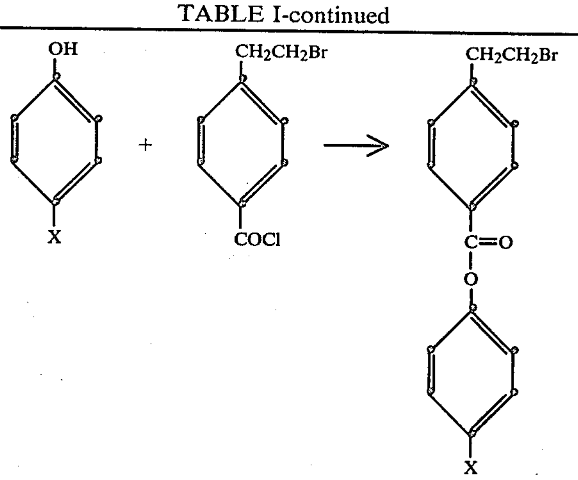
| Example | X | Yield, % | M.P., °C. | Anal. Calculated C | H | N | S | Br | Found C | H | N | S | Br |
|---|---|---|---|---|---|---|---|---|---|---|---|---|---|
| (6a) | $-SO_2-NH-$ 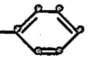 | 86.1 | 156-7 | 54.8 | 3.9 | 3.0 | 7.0 | 17.4 | 54.7 | 4.1 | 3.4 | 7.4 | 17.4 |
| (7a) | $-SO_2-NH-(CH_2)_3CH_3$ | 90.8 | 133-4 | 51.8 | 5.0 | 3.2 | 7.3 | 18.1 | 51.4 | 5.1 | 3.3 | 7.4 | 18.0 |
| (3a) | $NH-SO_2-(CH_2)_2CH_3$ | 81.8 | 148-9 | 50.7 | 4.7 | 3.3 | 7.5 | 18.7 | 51.0 | 4.9 | 3.5 | 7.2 | 19.2 |
| (2a) | $NH-SO_2CH_2CH_3$ | 78.8 | 162-3 | 49.5 | 4.4 | 3.4 | 7.8 | 19.4 | 49.8 | 4.6 | 3.4 | 7.2 | 19.9 |
TABLE II
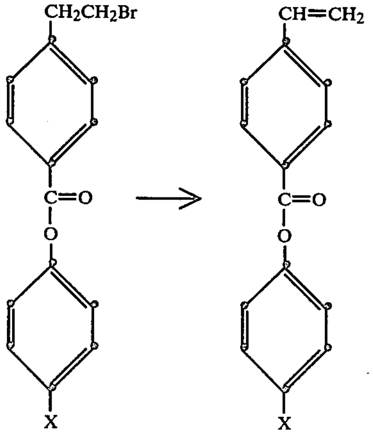
| Example | X | Yield, % | M.P., °C. | Anal. Calculated C | H | N | S | Found C | H | N | S |
|---|---|---|---|---|---|---|---|---|---|---|---|
| (5b) | $-CH_2-NHSO_2CH_3$ | 56.2 | 167-8 | 61.6 | 5.2 | 4.2 | 9.7 | 61.3 | 5.1 | 4.4 | 9.5 |
| (1b) | $-NHSO_2CH_3$ | 52.7 | 172-3 | 60.5 | 4.8 | 4.4 | 10.1 | 59.7 | 5.1 | 4.5 | 10.7 |

TABLE II-continued

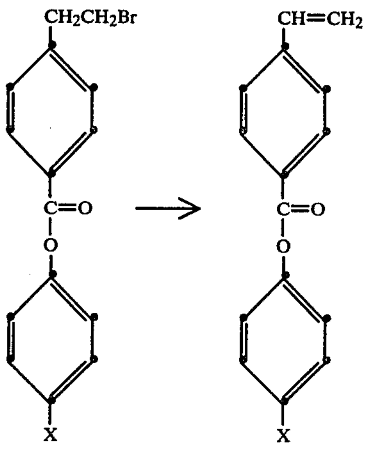

| Example | X | Yield, % | M.P., °C. | Anal. Calculated C | H | N | S | Anal. Found C | H | N | S |
|---|---|---|---|---|---|---|---|---|---|---|---|
| (4b) | $-NHSO_2$ 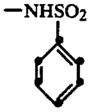 | 51.1 | 137–40 | 66.5 | 4.5 | 3.7 | 8.5 | 64.6 | 4.4 | 3.7 | 8.2 |
| (6b) | $-SO_2NH$ 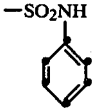 | 76.7 | 59–60 | 66.5 | 4.5 | 3.7 | 8.5 | 65.8 | 4.3 | 3.7 | 9.0 |
| (7b) | $-SO_2NH-(CH_2)_3CH_3$ | 84.33 | 112–14 | 63.5 | 5.9 | 3.9 | 8.9 | 63.3 | 5.5 | 3.8 | 8.7 |
| (3b) | $-NH-SO_2(CH_2)_2CH_3$ | 43.9 | 106–7 | 62.6 | 5.5 | 4.1 | 9.3 | 62.8 | 5.7 | 4.2 | 8.7 |
| (2b) | $-NH-SO_2CH_2CH_3$ | 70.0 | 124–9 | 57.6 | 4.9 | 3.9 | 8.9 | 57.9 | 5.3 | 4.0 | 9.4* |

*Analysis calculated for 65% product, 35% 4'-ethanesulfonamidophenyl 4-(2-bromoethyl)benzoate.

EXAMPLES 8–12

Polymerization of 4-(α-Methanesulfonamido)tolyl 4-vinylbenzoate

A solution of 8.0 g of 4-(α-methanesulfonamido)tolyl 4-vinylbenzoate and 72 ml of N,N-dimethylformamide was purged with nitrogen. 2,2'-Azobis(2-methylpyropionitrile) (0.04 g) was added and the solution was heated in a 60° C. bath with nitrogen bubbling for 17.5 hours. The solution was poured into ether to precipitate polymer which was isolated, rinsed again with ether and dissolved in acetone containing a small amount of water. The solution was poured into ether to precipitate polymer which was collected and dried. The yield of polymer was 4.7 g (58.8% conversion).

Analysis calculated for $C_{17}H_{17}NO_4S$: C, 61.6; H, 5.2; N, 4.2; S, 9.7. Found: C, 61.1; H, 5.2; N, 4.4; S, 10.0.

The inherent viscosity was determined to be 0.43 and the glass transition temperature was measured as 158° C.

The above procedure was followed to achieve the synthesis of the polymers listed in Table III which follows:

TABLE III

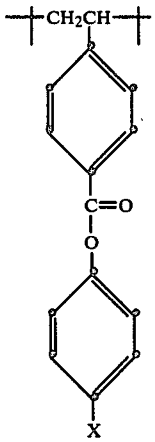

| Example | X | Conversion, % | I.V. dl/g | Tg, °C. | Anal. Calculated C | H | N | S | Anal. Found C | H | N | S | Sol. |
|---|---|---|---|---|---|---|---|---|---|---|---|---|---|
| 8 | $-CH_2NHSO_2CH_3$ | 58.8 | 0.43 | 158 | 61.6 | 5.2 | 4.2 | 9.7 | 61.1 | 5.2 | 4.4 | 10.0 | acetone |
| 9 | $-NHSO_2CH_3$ | 73.3 | 0.69 | 188 | 60.6 | 4.7 | 4.4 | 10.1 | 58.3 | 4.9 | 4.5 | 10.6 | " |
| 10 | $-NHSO_2CH_2CH_3$ | 60.6 | 0.60 | 161/211 | 61.6 | 5.2 | 4.2 | 9.7 | 60.2 | 5.8 | 4.0 | 9.2 | " |
| 11 | $-NHSO_2(CH_2)_2CH_3$ | 76.3 | 0.95 | 149 | 62.6 | 5.5 | 4.1 | 9.3 | 62.3 | 5.9 | 4.1 | 8.7 | " |
| 12 | $-SO_2NH-$ 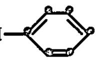 | 58.7 | 1.11 | 156 | 66.5 | 4.5 | 3.7 | 8.5 | 66.0 | 4.7 | 3.4 | 8.7 | " |

EXAMPLES 13-17

Photographic Elements

Dopes were prepared according to the formula given below and were coated at about 100 microns wet thickness on subbed poly(ethylene terephthalate) support.

| | |
|---|---|
| Phthalaldehyde | 0.320 g |
| Cobalt (III) hexammine trifluoroacetate | 0.200 g |
| 2-Isopropoxy-1,4-naphthoquinone | 0.0108 g |
| SF-1066 Surfactant (a stable copolymer of dimethyl polysiloxane and a polyoxyalkylene ether sold by General Electric Co.) | 0.040 g |
| Polymeric binder | 1.90 g |
| Acetone | 7.60 g |

The coating block was set at 90° F. during coating and for one minute thereafter, then heated at 140° F. for five minutes for further drying. The sensitometry of the films was determined from prints prepared by contact exposing the film for about eight seconds through a 0.3 log E step tablet in an IBM Microcopier IID, Model 9954 exposing apparatus and then developing the image by contacting the back of the film for five seconds to a hot block set at 140° C. Results are recorded in the following Table IV:

TABLE (IV)

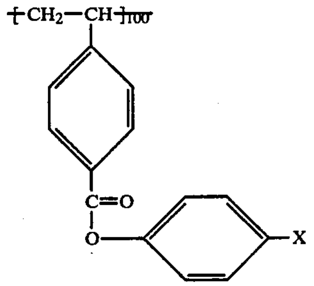

| Example | X | Polymer Tg (°C.) | Rel. Speed (Log E) | Maximum Neutral Density |
|---|---|---|---|---|
| 13 | $-CH_2NHSO_2CH_3$ | 158° | −0.20 | 1.6 |
| 14 | $-SO_2NH-$  | 156° | −0.90 | 0.5 |
| 15 | $-NHSO_2CH_2CH_2CH_3$ | 149° | −0.50 | 1.9 |
| 16 | $-NHSO_2CH_2CH_3$ | 161° | −0.90 | 1.6 |
| 17 | $-NHSO_2CH_3$ | 158° | −0.30 | 2.2 |

The invention has been described in detail with particular reference to preferred embodiment thereof, but it will be understood that variations and modifications can be effected within the spirit and scope of the invention.

What is claimed is:

1. A polymer comprising:

(a) about 1 to 100 mole percent of one or more units having the formula:

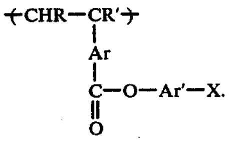

wherein:

R and R′ are independently selected from the group consisting of H, halide and alkyl;

Ar and Ar′ are independently arylene;

X is selected from the group consisting of $NHSO_2R_2$, $CH_2NHSO_2R_2$ and $SO_2NHR^2$ and $R^2$ is selected from the group consisting of alkyl, aryl and aralkyl, and (b) 0 to 99 mole percent of one or more additional polymerized ethylenically unsaturated polymerizable monomers.

2. The polymer of claim 1 wherein R and R′ are hydrogen, Ar and Ar′ are phenylene and X is $SO_2NHR^2$ and $R^2$ is $CH_3$.

3. The polymer of claim 1 having an inherent viscosity within the range of from about 0.4 to about 1.2.

* * * * *